United States Patent [19]

Sharpe-Geisler

[11] Patent Number: 5,410,268
[45] Date of Patent: Apr. 25, 1995

[54] LATCHING ZERO-POWER SENSE AMPLIFIER WITH CASCODE

[75] Inventor: Bradley A. Sharpe-Geisler, San Jose, Calif.

[73] Assignee: Advanced Micro Devices, Inc., Sunnyvale, Calif.

[21] Appl. No.: 118,432

[22] Filed: Sep. 8, 1993

[51] Int. Cl.⁶ .................. H03K 5/12; H03K 5/153; G01R 19/00
[52] U.S. Cl. ...................... 327/51; 327/170; 327/7; 327/78; 327/72
[58] Field of Search .............. 307/530, 443, 475, 263, 307/516, 354, 362; 327/51, 170, 7, 78, 77

[56] References Cited

U.S. PATENT DOCUMENTS

| | | | |
|---|---|---|---|
| 5,189,322 | 2/1993 | Chan et al. | 307/530 |
| 5,272,670 | 12/1993 | Hashimoto | 307/530 |
| 5,291,080 | 3/1994 | Amagasaki | 307/475 |

OTHER PUBLICATIONS

U.S. patent application Ser. No. 08/034,537, "Cascode Array Cell Partitioning For A Sense Amplifier Of A Programmable Logic Device", Filed. Mar. 19, 1993.
U.S. patent application Ser. No. 07/754,920, "Dual Port Memory, Such As Used In Color Lookup Tables For Video Systems", Filed Sep. 4, 1991.

*Primary Examiner*—William L. Sikes
*Assistant Examiner*—Fetsum Abraham
*Attorney, Agent, or Firm*—Fliesler, Dubb Meyer & Lovejoy

[57] ABSTRACT

A zero-power sense amplifier for implementing a wide or multiple input NOR gate for receiving a product term of a group of array cells in a programmable logic device (PLD). In a sleep mode, or low power mode, the zero-power sense amplifier latches its previous state while drawing negligible power rather than returning to one particular state, such as a low state, as in previous devices, enabling recovery time to be reduced after entering an awake mode. The zero power sense amplifier further reduces recovery time upon powering up from a sleep mode by maintaining the product term voltage close to a threshold input voltage during sleep mode while still drawing negligible power.

27 Claims, 3 Drawing Sheets

+⊞+ INDICATES
PROGRAMMABLE CELL

LATCHING ZERO-POWER SENSE AMPLIFIER WITH CASCODE

BACKGROUND OF THE INVENTION

1. Field of the Invention

The present invention relates to sense amplifiers used in a programmable logic device (PLD) to implement wide or multiple input NOR gates. More particularly, the present invention relates to circuitry for a zero-power sense amplifier responsive to a sleep mode signal to reduce power consumed by the zero-power sense amplifier during the sleep mode.

2. Description of the Prior Art

Prior Art PLD Utilizing a Sense Amplifier

FIG. 1 shows an array structure for a typical prior art programmable array logic (PAL) device, a type of PLD which utilizes a sense amplifier to implement a multiple input NOR gate. The PAL of FIG. 1 has six inputs $I_{0-5}$ and four outputs $O_{0-3}$. The inputs $I_{0-5}$ each have a true output 104 and a complement output 106 forming rows connected to programmable array cells, such as 110, of programmable array cells 108. An array cell, such as cell 110, may be programmed to be connected or disconnected to an AND gate in the AND array 100. Groups of array cells connected to an AND gate in AND array 100, such as shown at 112, are called a product term. The AND array 100 is followed by an OR array 102 to provide a sum of products term output. The OR array may be connected to an output logic macrocell 114 which is programmable to be either registered or combinatorial. Circuitry similar to that shown in FIG. 1, including the output logic macrocell 114, is utilized on the AmPALCE22V10, a device manufactured by Advanced Micro Devices, Inc.

Sense amplifiers are utilized by manufacturers to implement the AND gates in the AND array 110. The AND gates are implemented using multiple input NOR gates with true and complement row connections to array cells reversed internally. The sense amplifiers are utilized to implement the multiple input NOR gates to provide sufficient output voltage to the OR gate array 102 at high speed. Sense amplifiers convert a small voltage from the product term into a larger, rail to rail, voltage to supply to an OR gate.

Prior Art Sense Amplifier

FIG. 2 shows components of a sense amplifier 200 used to implement the multiple input NOR gate on a PLD, such as the AmPALCE22V10. The sense amplifier 200 of FIG. 2 is also shown connected to array cells 202, similar to array cells 108 of FIG. 1, to receive a single product term, such as 112 of FIG. 1. Array cells 202 of FIG. 2 receive input signals from rows 1–3 and are connected to form a product term (PT) line connection to sense amplifier 200. The array cells have lines connected to form a product term ground (PTG) line connection to sense amplifier 200.

In operation, the PT line will be high if all of the cells are off, or not conducting. The PT line will be low if one or more cells are on, or conducting. A cell will conduct if it is programmed and if its associated row line is high.

The sense amplifier 200 includes an amplifier consisting of two inverters 204 and 205. The first inverter 204 includes an p-channel pull up transistor 206 and an n-channel pull down transistor 208. The second inverter 205 includes a p-channel pull up transistors 210 and an n-channel pull down transistor 212. The input of the first inverter 204 forms the amplifier input which is further connected to the PT line of the array cells 202. The circles on transistors, such as on transistors 206 and 210, indicate a P-type transistor, while no circle on a transistor indicates an N-type transistor.

The sense amplifier 200 additionally includes a voltage clamp consisting of transistors 214 and 216. The voltage clamp 214, 216 provides feedback from the input of the second inverter 205 to the input of the first inverter 204. The clamp 214, 216 is provided since the PT line has a high capacitance due to the number of cells connected to it. With the high capacitance of the PT line, by limiting the voltage swing to small displacements around the threshold of the amplifier utilizing the clamp 214, 216 higher speeds are provided.

Further included in sense amplifier 200 is a current source transistor 218 controlled by a voltage reference VBSPRF to supply current at the PT line connection to the amplifier input. A PTG current sink transistor 220 controlled by a voltage reference VSARF1 is connected to the PTG line connection to the array cells 202.

In operation, when all cells are off, the current source 218 will provide current to pull the PT line up until node 250 is driven sufficiently low so that current sunk by clamp transistor 216 just balances the current sourced by current source 218. A low at node 250 will result in a high at SAOUT by means of inverter 205.

When one or more cells turn on, the PT line will be pulled low. The PTG current sink transistor 220 will then function as a current sink. Reference voltage VSARF1 is a current limiting voltage such that the PTG current sink transistor 220 can sink more current than sourced by current source transistor 218. Clamping is provided during turn on so that the PT line voltage will drop until node 250 is sufficiently high that clamp transistor 214 will source just enough current to balance the excess sink capacity of the PTG current sink transistor 220. Again, clamping limits the voltage swing to small displacements around the threshold of the amplifier to provide higher output switching speeds.

With the sense amplifier 200 of FIG. 2, performance is limited by the effectiveness of the clamp 214, 216 to limit the voltage swing of the PT line, as well as the slew-rate of the PT line. The slew-rate of the PT line is proportional to the non-equilibrium current driving the product term and inversely proportional to the capacitance of the PT line.

Prior Art Zero-Power Parts

With the introduction of notebook computers and other devices utilizing battery power, electronic circuits in the devices are required to utilize as little power as possible to preserve the batteries for an extended period of time. Even with devices which are not battery powered, it is desirable to have electronic circuits which operate with as little power consumption as possible to conserve energy, thus reducing operational costs.

Manufacturers have developed specialized electronic parts, called zero power parts, for use in battery powered devices such as notebook computers. The zero power parts have a low power consumption mode, also referred to as a sleep mode, which is entered when the zero power part has not been accessed for a period of time. To create the sleep mode, a sleep mode signal is developed by circuitry in the zero-power part and is transmitted in a true state to turn off internal components of the zero power part when an input signal has not been received for a period of time. The sleep mode signal is transmitted in a complement state to power up, or wake up the internal components of the zero-power part from a sleep mode when another input signal to the zero-power part is received.

For the AmPALCE22V10 discussed above, a zero power version, the AmPALCE22V10Z-25, is also available from Advanced Micro Devices, Inc. The AmPALCE22V10Z-25 operates at a lower speed because the AmPALCE22V10 does not require time to be powered up from a sleep mode.

Prior Art Zero-Power Sense Amplifier

The AmPALCE22V10Z-25 includes a zero-power sense amplifier to implement a multiple input NOR gate. A zero-power sense amplifier differs from a standard sense amplifier in that it includes zero-power circuitry connected to reduce power consumption during a sleep mode. During a sleep mode, the zero-power sense amplifier will draw negligible power.

In prior art zero-power sense amplifiers, the zero-power circuitry connected to the sense amplifier placed the output of the sense amplifier, SAOUT, in one state, usually a low state, independent of the state of the input signal on the PT line prior to a sleep mode being entered. When a signal was received by the zero-power sense amplifier to power up, the zero-power circuitry enabled the zero-power sense amplifier to power up and to obtain an output required by the current input signal after a recovery time period.

The performance of a zero-power sense amplifier is measured by how quickly the zero-power sense amplifier can recover from a sleep state and respond to a changing input signal.

SUMMARY OF THE INVENTION

The present invention provides a reduced recovery time over prior art zero-power sense amplifiers by maintaining the previous state of the amplifier when in a sleep mode while still utilizing negligible power, rather than returning to one particular state, such as to a high or low state.

The present invention further reduces recovery time by maintaining the product term voltage close to a threshold input voltage during sleep mode while still drawing negligible power.

The sense amplifier includes an amplifier which has an output state depending upon an input signal received from a product term line and a means for latching a previous state of the amplifier output during a sleep mode while drawing negligible power. The previous state of the amplifier is latched to enable recovery time to be reduced after entering an awake mode.

The means for latching includes an isolation pass gate made up of two transistors having current paths coupled in parallel between the amplifier input and the product term line. The latching means further includes two transistors with current paths coupled in series between the amplifier input and $V_{SS}$. The two series and two parallel latching transistors have gates controlled by a signal indicating when a sleep mode is entered as well as a feedback signal from the amplifier.

The sense amplifier also includes a threshold maintaining means coupled between the amplifier input and the product term line for maintaining the product term line at a voltage close to the threshold voltage of the amplifier input while still enabling the product term line to draw negligible power during a sleep mode. The threshold maintaining means further enables the zero-power sense amplifier to reduce recovery time over prior art zero-power sense amplifiers.

The threshold maintaining means includes a transistor configured as a cascode with a current path coupled between the input to the isolation pass gate and the product term line. A gate voltage of the cascode transistor is set to prevent current flow when a voltage on the product term line rises to within a predetermined value with respect to the threshold voltage of the amplifier input.

BRIEF DESCRIPTION OF THE DRAWINGS

Further details of the present invention are explained with the help of the attached drawings in which.

DETAILED DESCRIPTION

Zero Power Sense Amplifier-First Embodiment

Figure 1:
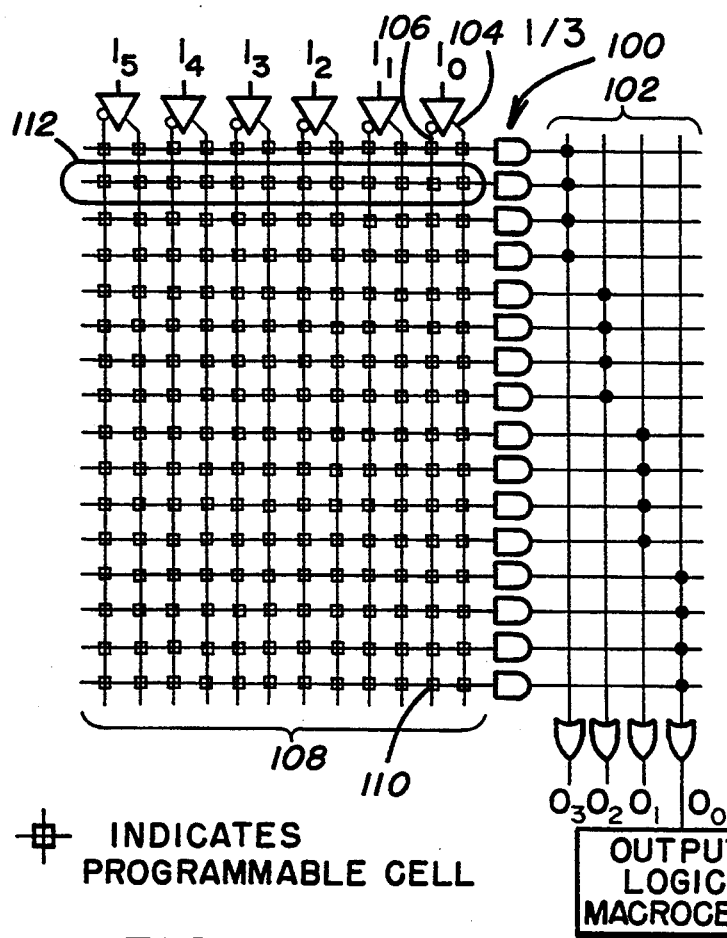
FIG. 1 shows an array structure for a typical prior art PAL device utilizing a sense amplifier to implement a multiple input NOR gate.
Figure 2:
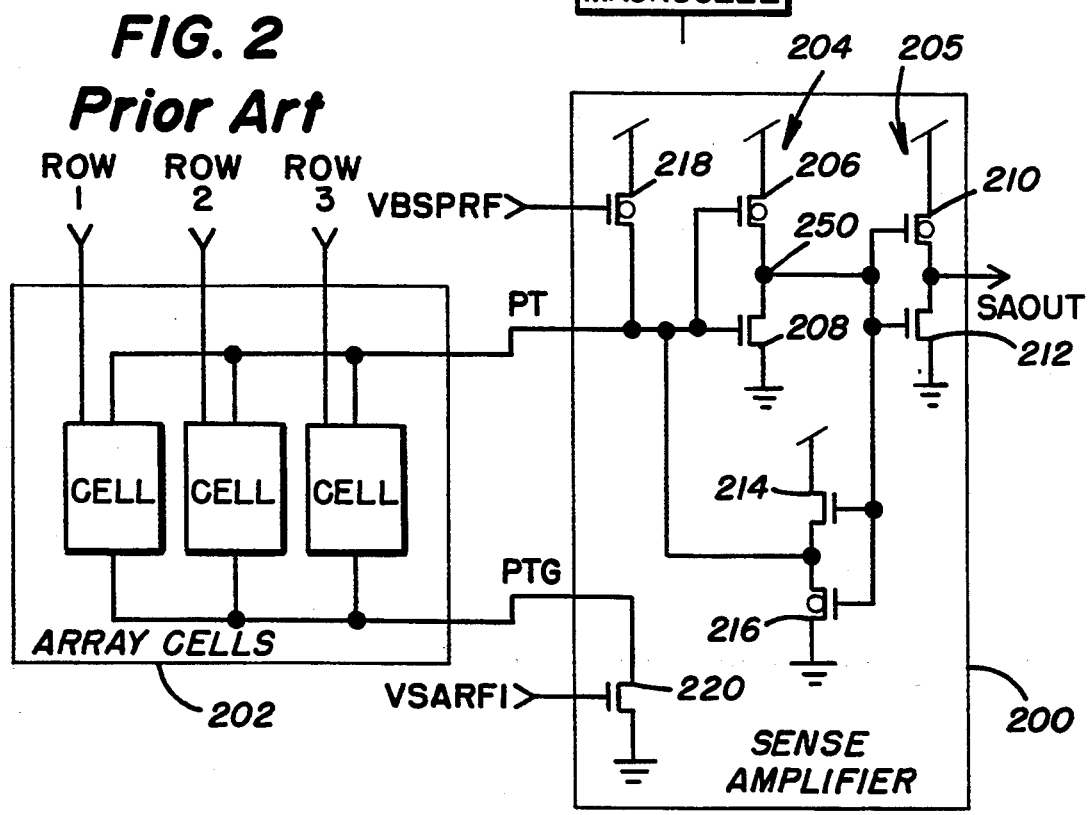
FIG. 2 shows components of a sense amplifier 200 used to implement the multiple input NOR gate.
Figure 3:
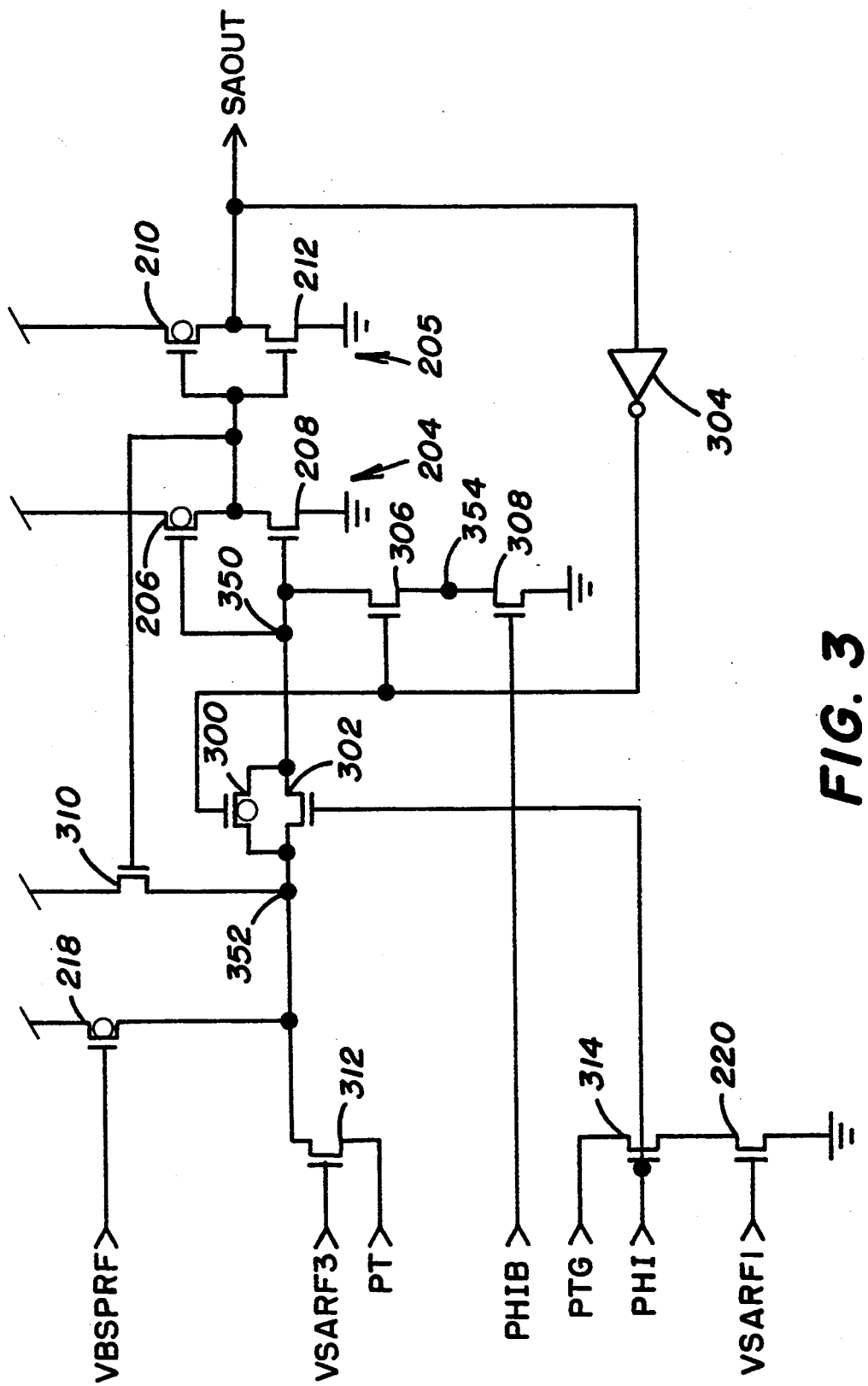
FIG. 3 shows a first embodiment of the zero-power sense amplifier of the present invention.

FIG. 3 shows a first embodiment of the zero-power sense amplifier of the present invention. The zero-power sense amplifier of FIG. 3 includes components carried over from the sense amplifier 200 of FIG. 2 including the amplifier which includes inverters 204 and 205, a current source transistor 218 with a gate coupled to voltage reference VBSPRF, and a PTG current sink transistor 220 with a gate coupled to voltage reference VSARF1. The zero-power sense amplifier of FIG. 3 also includes connections to a product term (PT) line and a product term ground (PTG) line similar to the sense amplifier 200 of FIG. 2. For convenience, components of FIG. 2 which are carried over to FIG. 3 are labeled with identical reference numbers.

In addition to the circuitry carried over from FIG. 2, FIG. 3 includes added circuitry in order to implement a low power mode for zero-power operation. First an isolation pass gate has been added which includes two parallel latching transistors 300 and 302 with current paths connected in parallel between a node 350 at the input of amplifier 204, 205 and a node 352 connected to current source 218. The gate of transistor 300 is connected to the output of an inverter 304 which provides feedback from the output SAOUT of amplifier 204, 205. The gate of transistor 302 is connected to a line PHI which carries a sleep mode signal indicating a sleep mode in a low state. The isolation pass gate is inserted to isolate the input of the first inverter 204 during a sleep state.

Circuitry to implement the low power mode additionally includes, two series latching transistors 306 and 308 with current paths connected in series between node 350 at the input of the amplifier 204, 205 and $V_{SS}$. The current paths of the series latching transistors 306 and 308 are separated by a node 354. The gate of transistor 306 is coupled to the output of inverter 304. The gate of transistor 308 is connected to a line PHIB which carries a sleep mode signal indicating the sleep mode in a high state. The two series latching transistors 306 and 308 function along with two parallel latching transistors 300 and 302 so that during sleep mode node 350 will be clamped to either $V_{DD}$ or $V_{SS}$. The two series and two parallel latching transistors latch the previous state of sense amplifier in a sleep mode in a manner so that the inverter 204 of amplifier 204, 205 draws substantially no power.

Circuitry added to implement the low power mode also includes a clamping transistor 310. Clamping transistor 310 has a gate connected to the output of inverter 204 and a current path coupled from $V_{DD}$ to node 352. As with the clamping transistor 214 of FIG. 2, clamping transistor 310 limits the voltage swing of node 352 to a small displacement below the threshold of the amplifier input.

Circuitry added to implement the low power mode also includes a transistor 312 connected in a cascode configuration having a current path coupled between the PT line and node 352. The cascode transistor 312 has a gate connected to voltage reference VSARF3 which is set to turn off cascode transistor 312 when a voltage on the PT line is within a few tenths volts of the threshold of the amplifier 204, 208. With the cascode transistor 312, even though node 352 goes to $V_{DD}$ during sleep mode, voltage on the PT line remains near the threshold of amplifier 204, 208 because the cascode transistor 312 shuts off when voltage on the PT line rises to the threshold. Cascode transistor 312 provides voltage gain so that a relatively small change of voltage on the high capacitance PT line can result in a much greater swing of the relatively low capacitance node 352.

A transistor such as transistor 312 which is configured to be a cascode is configured to be turned on and off by varying voltage applied to the source with the gate voltage fixed, rather than varying the gate voltage. In a cascode transistor with $(v_g - v_s) > v_t$, wherein $v_g$ is the gate voltage, $v_s$ is the source voltage, and $v_t$ is the threshold voltage of the cascode transistor, the cascode transistor will turn on. With $(v_g - v_s) > v_t$, the cascode transistor will turn off. Since transistor 312 is set to turn off at the threshold of amplifier 204, 205, the cascode transistor will turn off when voltage on the PT line rises to $VSARF3 - v_t$ which is typically around 2.0 volts.

A PTG switching transistor 314 is further included in the circuitry to implement the low power mode. The PTG switching transistor 314 has a current path coupled between the PTG current sink transistor 220 and the PTG line, and a gate coupled to the PHI line. Thus during a sleep mode, transistor 312 cuts off the path to ground or $V_{SS}$ for an array cell enabling negligible power to be drawn when a cell is conducting.

Operation of First Embodiment

1. Awake State, No Cell Conducting

In operation, we begin by assuming a first state where the sleep mode signal indicates an awake state with PHI being high and PHIB being low, and no array cell on the PT line is conducting.

With PHI being high and PHIB being low, transistors 314 and 302 will be on, while transistor 308 will be off. Further, with no cell conducting, current source 218 will pull up node 352. The current provided by current source 218 will cause the voltage on the PT line to rise until voltage on the drain of cascode transistor 312 reaches $VSARF3 - v_t$ which will typically be set to occur around 2.0 volts, or slightly below the threshold of amplifier 204, 205. Cascode transistor 312 will then turn off and node 352 will be pulled up to $V_{DD}$.

Transistor 314 being on will create a path to ground for the PTG line through PTG current sink transistor 220. However, since no cell is currently on, no current will be sunk by PTG current sink transistor 220.

With node 352 high, the output of inverter 204 will be low and SAOUT will be high because of the action of inverters 204 and 205 respectively. Because SAOUT is high, the output of inverter 304 will be low which will turn on pass gate transistor 300 and keep transistor 306 off. With transistor 300 on, a path is created between node 352 which is at $V_{DD}$ and node 350 pulling node 350 up to $V_{DD}$.

Note that inverter 304 provides an output which is equivalent to the output of inverter 204, which could have been utilized to provide the amplifier feedback. Inverter 304 was added rather than utilizing a feedback connection from inverter 204 in order to drive transistors 300 and 306 without adding any extra capacitance to the output of inverter 204.

2. Transition To Sleep State, No Cell Conducting

We next assume that a second state is entered in which transition is made to sleep state with PHI switching to low and PHIB switching to high, and that all array cells remain off.

With PHI going low and PHIB going high, transistors 314 and 302 will turn off while transistor 308 turns on. Nothing changes. Node 352 remains at $V_{DD}$ so that the output of inverter 304 is still low which keeps transistor 300 on creating a current path from node 352 to node 350 irrespective of transistor 302 turning off. Transistor 308 turning off also has no effect since transistor 306 remains off. Node 350 will thus remain at $V_{DD}$. Transistor 314 turning off also has no effect since no cell is conducting.

3. Transition To Awake State, No Cell Conducting

We next assume that a transition is made back to the first awake state with PHI switching back to high and PHIB switching back to low, and no array cell is conducting.

With PHI being high and PHIB being low, transistors 314 and 302 will be on, while transistor 308 will be off. Nothing changes. Since no cell has come on and transistor 300 remains on with transistor 306 off, the switching of transistors 314, 302 and 308 will be irrelevant and we will return to the conditions of the first state described above.

4. Awake State, Transition To A Cell Conducting

We next assume a third state is entered in which the awake state is still maintained with PHI remaining high and PHIB remaining low, while an array cell now turns on.

With PHI high and PHIB low, transistors 314 and 302 are on while transistor 308 is off. With transistor 314 on, the voltage on the PT line is pulled down through the on cell by PTG current sink 220, which turns on cascode transistor 312 and pulls down node 352. The PTG current sink 220 is sized to sink current in excess of what is sourced by current source 218 in order to pull node 352 down.

As node 352 drops, so does node 350 because both transistors 302 and 300 are on. As node 350 crosses the threshold of inverter 204, the output of inverter 204 will rise until the current through clamping transistor 310 just equals the excess current, thus clamping node 352 at a voltage slightly below the threshold of inverter 204. Maintaining node 352 just below the threshold of inverter 204 is necessary to prevent the voltage on the PT line from going too low which would adversely effect recovery time for the low to high transition. Note that the threshold of inverter 204 should be set on the high side with transistor 206 large and transistor 208 small in order to minimize the delay for high to low transitions.

Because the output of inverter 204 is high, SAOUT switches to low. In turn, the output of inverter 304 becomes high turning off transistor 300 and turning on transistor 306. Transistor 300 being off at this time has no effect since transistor 302 is on. Additionally, transistor 306 being on has no effect at this time since transistor 308 is off.

5. Transition To Sleep State, A Cell Conducting

We next assume a fourth state is entered in which transition is made to a sleep state with PHI switching to low and PHIB switching to high, and that an array cell remains on.

With PHI going low and PHIB going high, transistors 314 and 302 will turn off while transistor 308 turns on. With both transistors 300 and 302 being now off and both transistors 306 and 308 now being on, node 352 is pulled down the rest of the way to 0 volts through transistors 306 and 308. Nodes 350 and 352 will be isolated. Because transistor 314 is off, current through the on cell(s) is interrupted so that the voltage on the PT line will rise until cascode transistor 312 turns off. Node 352 will then be pulled up to $V_{DD}$ via current source 218. We now have a stable condition where SAOUT is latched low, node 352 is at 0 volts, node 350 is at $V_{DD}$ and the PT line is at VSARF3-vt, or around 2.0 volts.

6. Transition To Awake State, A Cell Conducting

We next assume that a transition is made back to a third state with transition made to an awake state switching PHI back to high and PHIB back to low, while an array cell remains on.

With PHI going high and PHIB going low, transistors 314 and 302 will turn on while transistor 308 turns off. Because both isolation pass gate transistors 300 and 302 have been off, with transistor 302 turning on and node 352 being high, node 350 will begin to be pulled up. To avoid SAOUT changing states since node 352 is high, the capacitance of node 354 must be adjusted such that together with node 352 it is sufficiently large that when transistor 302 turns on, the charge stored in node 352, which is initially at $V_{DD}$, is shared by the combined nodes 350, 352 and 354 to result in a voltage that is below the threshold of inverter 204. Further, the capacitance of node 354 must be high enough to allow time for the voltage on the PT line to be pulled low through the conducting array cell and turn on cascode transistor 312 enough to balance the current from current source 218 before node 352 can be pulled up to the threshold voltage of inverter 204. With the capacitances sufficiently set, the third state as described above will be reentered.

7. Awake State, Transition To No Cell Conducting

We next return to the first state where an awake state is maintained with PHI remaining high and PHIB remaining low, while all conducting array cells now turn off.

With PHI high and PHIB low, transistors 314 and 302 are on while transistor 308 is off. The voltage at node 350 initially rises from 0 volts to something less than the threshold of inverter 204. Thereafter, because no cell is on, current source 218, and clamping transistor 310 while node 350 is sufficiently low, pull up node 352. Node 352 going high will pull the voltage on the PT line up to VSARF3−$v_t$, or around 2.0 volts, turning off cascode transistor 312. With cascode transistor 312 off, node 352 and node 350 will be pulled up to $V_{DD}$.

Note that, although node 350 is described as being pulled up to $V_{DD}$ when node 352 is pulled up to $V_{DD}$, node 350 in reality can only be pulled up to $V_{DD}$ minus the threshold voltage of transistor 302 in this case. Also note that the speed of the zero-power sense amplifier of the present invention is limited by how fast node 350 is pulled up and by how far it has to go to reach the threshold of inverter 204.

When node 350 high, the output of transistor 204 goes low, SAOUT goes high and the output of inverter 304 goes low. With the output of inverter 304 being low transistor 306 turns off, which has no immediate effect since transistor 308 is off, and transistor 300 turns on pulling node 352 up to $V_{DD}$. Conditions have now returned to conditions of the first state described previously.

Zero Power Sense Amplifier-Second Embodiment

Figure 4:
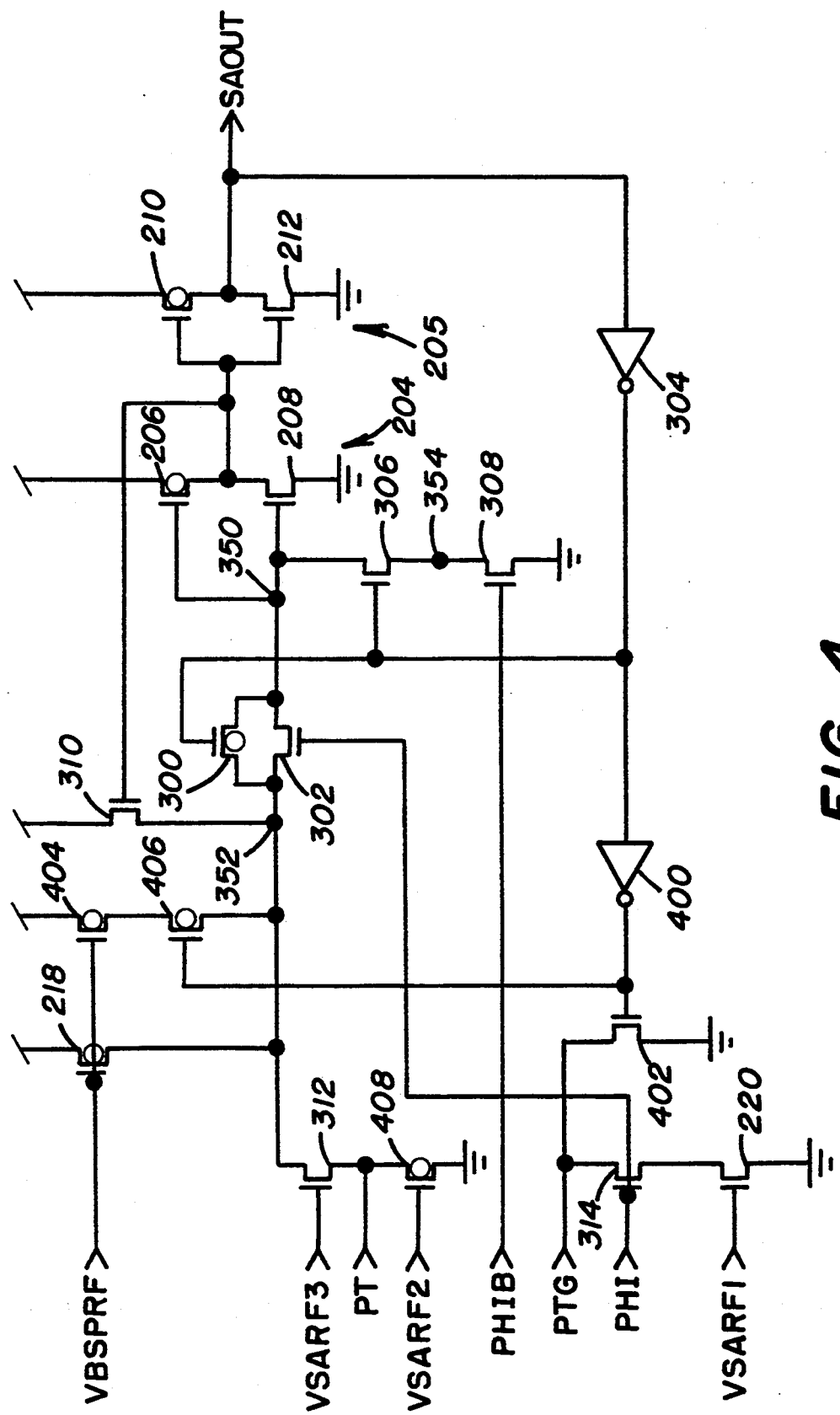
FIG. 4 shows a second embodiment of the zero-power sense amplifier of the present invention.

FIG. 4 shows a second embodiment of the zero-power sense amplifier of the present invention. FIG. 4 includes all the circuitry of FIG. 3 with additional circuitry added to enhance performance of the zero-power sense amplifier. For convenience, components of FIG. 3 which are carried over to FIG. 4 are labeled with identical reference numbers.

Circuitry added in FIG. 4 to the components of FIG. 3 include an additional feedback inverter 400 with an input coupled from the output of inverter 304. The output of inverter 400 is coupled to the gate of a parallel PTG current sink transistor 402 which has a current path connected between the PTG line and $V_{SS}$. Although not shown, transistor 402 can also be coupled with its drain connected to the source of transistor 314 rather than the PTG line.

The output of feedback inverter 400 is also coupled to the gate of a parallel current source switching transistor 406. Transistor 406 has a current path coupled in series with a parallel current source transistor 404 between $V_{DD}$ and node 352. The gate of transistor 404 is coupled to the reference voltage VBSPRF which is also coupled to the gate of current source 218.

A voltage limiting transistor 408 has also been added with a current path connected between the PT line and $V_{SS}$. The gate of voltage limiting transistor 408 is coupled to a voltage reference VSARF2.

Operation of Second Embodiment

In operation, the feedback inverter 400 drives parallel PTG current sink transistor 402 to speed the high to low transition when a cell turns on by bypassing current sink transistor 220. Shortly after the high to low transition, inverter 400 will switch states turning transistor 402 off so that it will have no effect on the D.C. characteristics of the zero-power sense amplifier.

Parallel current source transistors 404 boosts the pull-up of current source transistor 218 during low to high transitions. Feedback inverter 400 drives transistor 406 to connect parallel current source transistor 404 to node 352 when SAOUT is low. Transistors 404 and 406 do therefore affect the D.C. characteristics of the sense amplifier.

Voltage limiting transistor 408 has a gate control voltage VSARF2 set to assure that voltage on the PT line does not rise above a value which, depending on noise margin during a high to low transition, could result in a SAOUT going low during wake up even though an array cell is conducting.

Although the invention has been described above with particularity, this was merely to teach one of ordinary skill in the art how to make and use the invention.

Many modifications will fall within the scope of the invention, as that scope is defined by the following claims.

What is claimed is:

1. A sense amplifier receiving an input signal and a sleep mode signal which when active indicates low power is to be utilized, the sense amplifier comprising:
   an amplifier having a previous state dependent upon the input signal prior to the sleep mode signal becoming active; and
   means for latching the previous state when the sleep mode signal becomes active.

2. The sense amplifier of claim 1 wherein the means for latching enables an input to the amplifier to draw negligible power when the sleep mode signal is active.

3. The sense amplifier of claim 1 wherein the amplifier has an amplifier input and an amplifier output, wherein a current source is coupled to supply power to the amplifier input, and wherein the means for latching comprises:
   a feedback element having an input coupled to the amplifier output and providing an amplifier feedback output;
   first and second series latching transistors having current paths coupled in series between the amplifier input and a low power potential, the first series latching transistor receiving the sleep mode signal at a gate and not conducting when the sleep mode signal is active and conducting when the sleep mode signal is inactive, the second series latching transistor receiving the amplifier feedback output at a gate and conducting when the amplifier feedback output is in a first state and not conducting when the amplifier feedback output is in a second state; and
   first and second parallel latching transistors having current paths coupled in parallel between the current source and the amplifier input, the first amplifier parallel latching transistor receiving the sleep mode signal at a gate and conducting when the sleep mode signal is active and not conducting when the sleep mode signal is inactive, the second parallel latching transistor receiving the amplifier feedback output at a gate and not conducting when the amplifier feedback output is in the first state and conducting when the amplifier feedback output is in the second state.

4. The sense amplifier of claim 3, wherein the amplifier input has a threshold voltage, the sense amplifier further comprising:
   a product term line coupled to a plurality of array cells; and
   a cascode having a current path coupled on a first end to the current source and on a second end to the product term line and having a gate voltage set to prevent current flow when a voltage on the product term line rises to within a predetermined value with respect to the threshold voltage.

5. The sense amplifier of claim 4 further comprising:
   a product term low potential line coupled to the plurality of array cells;
   a product term low potential current sink transistor; and
   a product term low potential switching transistor having a current path coupled on a first end to the product term low potential line, and on a second end to the product term low potential current sink transistor, the produce term low potential switching transistor receiving the sleep mode signal at a gate and conducting when the sleep mode signal is inactive and not conducting when the sleep mode signal is active.

6. The sense amplifier of claim 5 wherein the product term low potential current sink transistor sinks an excess current greater than current supplied by the current source, and wherein the amplifier comprises:
   a first inverter having a first inverter input forming the amplifier input and a first inverter output; and
   a second inverter having a second inverter input coupled to the first inverter output, and wherein the sense amplifier further comprises:
   a clamping transistor having a current path coupled between a power supply and the current source and a gate input coupled to the first inverter output, the clamping transistor sourcing the excess current.

7. The sense amplifier of claim 3 wherein the first state of the amplifier feedback output occurs when the amplifier output is low and the second state of the amplifier feedback output occurs when the amplifier output is high.

8. The sense amplifier of claim 3 wherein the feedback element comprises an inverter.

9. The sense amplifier of claim 4 comprising:
   a voltage limiting transistor coupled from the product term line to the low power potential and having a gate voltage set to allow current flow when a voltage on the product term line rises to a predetermined maximum value.

10. The sense amplifier of claim 5 further comprising:
    a parallel product term low potential current sink transistor having a current path coupled between the product term low potential line and the low power potential, the product term low potential current sink transistor receiving the amplifier feedback output at a gate and conducting when the amplifier feedback output is in the second state and not conducting when the amplifier feedback output is in the first state.

11. The sense amplifier of claim 10 further comprising:
    a parallel current source;
    a parallel current source transistor having a current path connected between the current source and the parallel current source, the parallel current source switching transistor receiving the amplifier feedback output at a gate and conducting when the amplifier feedback output is in the first state and not conducting when the amplifier feedback output is in the second state.

12. The sense amplifier of claim 11 wherein the feedback element comprises:
    a first inverter coupled between the amplifier output and a first node, the first node being coupled to the gate of the second series latching transistor and the gate of the second parallel latching transistor; and
    a second inverter coupled between the first node and a second node, the second node being coupled to the gate of the parallel product term low potential current sink transistor and the gate of the parallel current source switching transistor.

13. A sense amplifier comprising:
    an amplifier having an amplifier input with an input threshold voltage;
    a product term line coupled to a plurality of array cells; and threshold maintaining means coupled between the amplifier input and the product term line for maintaining the product term line at a voltage closer to the threshold voltage than if the amplifier input was connected to the product term line,
wherein the sense amplifier has a sleep mode during which limited power is utilized and wherein the product term line draws substantially no power during the sleep mode.

14. The sense amplifier of claim 13 wherein the threshold maintaining means comprises:
a cascode having a current path coupled on a first end to the amplifier input and on a second end to the product term line, and having a gate voltage set to prevent current flow when a voltage on the product term line rises to within a predetermined value with respect to the threshold voltage.

15. The sense amplifier of claim 14 further comprising:
a current source supplying a current to the amplifier input;
a product term low potential line coupled to the plurality of array cells; and
a product term low potential current sink transistor coupled to the product term low potential line to sink an excess current greater than current supplied by the current source, and wherein the amplifier comprises:
a first inverter having a first inverter input forming the amplifier input and a first inverter output; and
a second inverter having a second inverter input coupled to the first inverter output, and wherein the threshold maintaining means further comprises:
a clamping transistor having a current path coupled between a power supply and the current source and a gate coupled to the first inverter output, the clamping transistor sourcing the excess current to maintain voltage on the product term line close to the threshold voltage.

16. The sense amplifier of claim 13 further comprising:
a product term low potential line coupled to the plurality of array cells;
a product term low potential current sink transistor; and
a product term low potential switching transistor having a current path coupled on a first end to the product term low potential line, and on a second end to the product term low potential current sink transistor, the product term low potential switching transistor receiving a signal indicating whether the sleep mode is active at a gate and conducting when the sleep mode is inactive and not conducting during the sleep mode to enable the product term line to draw the substantially no power during the sleep mode.

17. The sense amplifier of claim 14 wherein the threshold maintaining means further comprises:
a voltage limiting transistor coupled from the product term line to the low power potential and having a gate voltage set to allow current flow when a voltage on the product term line rises to a predetermined maximum value.

18. A sense amplifier receiving a sleep mode signal which when active indicates low power is to be utilized, the sense amplifier comprising:
a product term line coupled to a plurality of array cells for receiving an input signal from the plurality of array cells indicating whether an array cell in the plurality of array cells is active;
an amplifier having an amplifier input with an input threshold voltage, the amplifier having a previous state dependent upon the input signal prior to the sleep mode signal becoming active;
means for latching the previous state when the sleep mode signal becomes active; and
threshold maintaining means coupled between the amplifier input and the product term line for maintaining the product term line at a voltage closer to the threshold voltage than if the amplifier input was connected to the product term line.

19. The sense amplifier of claim 18 wherein the means for latching enables the amplifier input to draw negligible power when the sleep mode signal is active.

20. The sense amplifier of claim 18 wherein the product term line draws substantially no power when the sleep mode signal is active.

21. The sense amplifier of claim 20 further comprising:
a product term low potential line coupled to the plurality of array cells;
a product term low potential current sink transistor; and
a product term low potential switching transistor having a current path coupled on a first end to the product term low potential line, and on a second end to the product term low potential current sink transistor, the product term low potential switching transistor receiving the sleep mode signal at a gate and conducting when the sleep mode signal is inactive and not conducting when the sleep mode signal is active to enable the product term line to draw the substantially no power when the sleep mode signal is active.

22. The sense amplifier of claim 18 wherein the amplifier further has an amplifier output, wherein a current source is coupled to supply power to the amplifier input, and wherein the means for latching comprises:
a feedback element having an input coupled to the amplifier output and providing an amplifier feedback output;
first and second series latching transistors having current paths coupled in series between the amplifier input and a low power potential, the first series latching transistor receiving the sleep mode signal at a gate and not conducting when the sleep mode signal is active and conducting when the sleep mode signal is inactive, the second series latching transistor receiving the amplifier feedback output at a gate and conducting when the amplifier feedback output is in a first state and not conducting when the amplifier feedback output is in a second state; and
first and second parallel latching transistors having current paths coupled in parallel between the current source and the amplifier input, the first parallel latching transistor receiving the sleep mode signal at a gate and conducting when the sleep mode signal is active and not conducting when the sleep mode signal is inactive, the second parallel latching transistor receiving the amplifier feedback output at a gate and not conducting when the amplifier feedback output is in the first state and conducting when the amplifier feedback output is in the second state.

23. The sense amplifier of claim 18 wherein the threshold maintaining means comprises:

a cascode having a current path coupled on a first end to the amplifier input and on a second end to the product term line, and having a gate voltage set to prevent current flow when a voltage on the product term line rises to within a predetermined minimum value with respect to the threshold voltage.

24. The sense amplifier of claim 23 further comprising:

a product term low potential line coupled to the plurality of array cells; and a product term low potential current sink transistor coupled to the product term low potential line to sink an excess current greater than current supplied by the current source, and wherein the amplifier comprises:

a first inverter having a first inverter input forming the amplifier input and a first inverter output; and a second inverter having a second inverter input coupled to the first inverter output, and wherein the threshold maintaining means further comprises:

a clamping transistor having a current path coupled between a power supply and the current source and a gate coupled to the first inverter output, the clamping transistor sourcing the excess current to maintain a voltage on the product term line close to the threshold voltage.

25. The sense amplifier of claim 23 wherein the threshold maintaining means comprises:

a voltage limiting transistor coupled from the product term line to the low power potential and having a gate voltage set to allow current flow when a voltage on the product term line rises to a predetermined maximum value.

26. A programmable array logic device receiving a sleep mode signal which when active indicates low power is to be utilized, the programmable array logic device comprising:

a plurality of programmable array cells comprising subpluralities of programmable array cells, each said subplurality comprising array cells with outputs coupled to a product term line and low potential lines coupled to a product term low potential line;

a plurality of sense amplifiers, each said sense amplifier in the plurality of sense amplifiers coupled to a given product term line and a given product term low potential line of one of the subpluralities of programmable array cells, each said sense amplifier comprising:

an amplifier having an amplifier input with a threshold voltage and an amplifier output, the amplifier comprising a first inverter having a first inverter input forming the amplifier input and a first inverter output and a second inverter having a second inverter input coupled to the first inverter output;

a current source;

a product term low potential current sink transistor which sinks an excess current greater than current supplied by the current source;

a product term low potential switching transistor having a current path coupled on a first end to the given product term low potential line, and on a second end to the product term low potential current sink transistor, the product term low potential switching transistor receiving the sleep mode signal at a gate and conducting when the sleep mode signal is inactive and not conducting when the sleep mode signal is active;

a clamping transistor having a current path coupled between a power supply and the current source and a gate coupled to the first inverter output, the clamping transistor sourcing the excess current;

a cascode having a current path coupled on a first end to the amplifier input and on a second end to the given product term line, and having a gate voltage set to prevent current flow when a voltage on the given product term line rises to within a predetermined minimum value with respect to the threshold voltage;

a feedback element having an input coupled to the sense amplifier output and providing an amplifier feedback output;

first and second series latching transistors having current paths coupled in series between the amplifier input and a low power potential, the first amplifier series latching transistor receiving the sleep mode signal at a gate and not conducting when the sleep mode signal is active and conducting when the sleep mode signal is inactive, the second series latching transistor receiving the amplifier feedback output at a gate and conducting when the amplifier feedback output is in a first state and not conducting when the amplifier feedback output is in a second state; and first and second parallel latching transistors having current paths coupled in parallel between the current source and the amplifier input, the first parallel latching transistor receiving the sleep mode signal and conducting when the sleep mode signal is active and not conducting when the sleep mode signal is inactive, the second parallel latching transistor receiving the amplifier feedback output and not conducting when the amplifier feedback output is in the first state and conducting when the amplifier feedback output is in the second state;

a plurality of OR gates coupled to receive the amplifier output from at least one said sense amplifier; and a plurality of output logic macrocells, each of the output logic macrocells coupled to an OR gate in the plurality of OR gates, each of the output logic macrocells being programmable to select whether its output will be registered or combinatorial.

27. The programmable array logic device of claim 26 wherein each said sense amplifier further comprises:

a parallel product term low potential current sink transistor having a current path coupled between the given product term low potential line and the low power potential, the product term low potential current sink transistor receiving the amplifier feedback output at a gate and conducting when the amplifier feedback output is in the second state and not conducting when the amplifier feedback output is in the first state;

a parallel current source;

a parallel current source switching transistor having a current path connected between the current source and the parallel current source, the parallel current source switching transistor receiving the amplifier feedback output at a gate and conducting when the amplifier feedback output is in the first state and not conducting when the amplifier feedback output is in the second state; and a voltage limiting transistor coupled from the given product term line to the low power potential and having a gate voltage set to allow current flow when a voltage on the given product term line rises to a predetermined maximum value.

* * * * *

UNITED STATES PATENT AND TRADEMARK OFFICE
CERTIFICATE OF CORRECTION

PATENT NO. : 5,410,268
DATED      : April 25, 1995
INVENTOR(S) : Bradley A. Sharpe-Geisler It is certified that error appears in the above-indentified patent and that said Letters Patent is hereby corrected as shown below:

Column 5, line 38, delete "$v_g-v_s)>vt$" and insert --$(v_g-v_s)<vt$--.

Column 7, line 64, after "310" insert --,--.

Signed and Sealed this

First Day of October, 1996

Attest:

BRUCE LEHMAN

Attesting Officer        Commissioner of Patents and Trademarks